United States Patent
Prasad et al.

(10) Patent No.: US 6,409,937 B1
(45) Date of Patent: Jun. 25, 2002

(54) MELT PROCESSIBLE THERMOTROPIC LIQUID CRYSTALLINE TERPOLYESTERS AND PROCESS FOR THE PREPARATION THEREOF

(75) Inventors: Vadakkethonippurathu Sivankutty Nair Prasad; Chennakkattu Krishna Sadasivan Pillai, both of Kerala; Marayil Ravindranathan, Gujarat, all of (IN)

(73) Assignees: Council of Scientific & Industrial Research; Department of Science and Technology, both of New Delhi (IN)

( * ) Notice: Subject to any disclaimer, the term of this patent is extended or adjusted under 35 U.S.C. 154(b) by 0 days.

(21) Appl. No.: 09/537,248

(22) Filed: Mar. 28, 2000

(51) Int. Cl.[7] ......................... C09K 19/20; C09K 19/38; C08G 63/60; C08G 63/81; C08G 63/83; C08G 63/78; C08G 63/88

(52) U.S. Cl. ........................... 252/299.67; 252/299.64; 252/299.65; 252/299.66; 524/176; 524/193; 524/194; 528/219

(58) Field of Search ........................ 252/299.01, 299.64, 252/299.65, 299.66, 299.67; 524/176, 193, 194; 528/219, 272, 300, 301, 302, 308, 308.6; 525/437, 444, 448

(56) References Cited

U.S. PATENT DOCUMENTS 4,889,886 A * 12/1989 Wada et al. ................. 524/449
5,326,848 A * 7/1994 Kashimura et al. ......... 528/190

FOREIGN PATENT DOCUMENTS

| JP | 10-60236 | * | 3/1998 |
| JP | 2000-318092 | * | 11/2000 |

OTHER PUBLICATIONS

JP 2000–318092 English Abstract, 2000.*
JP 10–60236 Engish Abstract, 1998.*

* cited by examiner

Primary Examiner—Shean C. Wu
(74) Attorney, Agent, or Firm—Ladas & Parry

(57) ABSTRACT

The invention relates to a process for the preparation of melt processable liquid crystalline terpolyesters of the general formula I

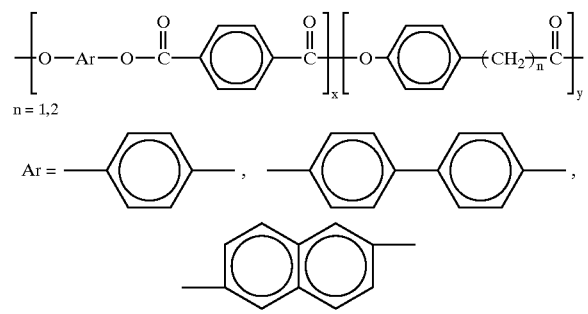

scheme 1
structure of poly[aryleneterephthalate-co-(4-oxyphenyl)acetal propionate]

by the in situ acetylation of a monomer selected from (4-hydroxyphenyl) acetic acid/ 3(4-hydroxyphenyl) propionic acid and hydroquinone/4,4'-biphenol/2,6-naphthylene diol followed by acidolysis polycondensation with or without a solvent and a catalyst, under reduced pressure for the efficient removal of acetic acid to effect higher molecular weight formation. Post polymerisation is effected at higher temperatures below the decomposition temperature purification by soxhlet extraction using solvent mixtures selected from acetone-alcohol, acetone-methylethyl ketone.

12 Claims, No Drawings

MELT PROCESSIBLE THERMOTROPIC LIQUID CRYSTALLINE TERPOLYESTERS AND PROCESS FOR THE PREPARATION THEREOF

FIELD OF THE INVENTION

The present invention relates to melt processible thermotropic liquid crystalline terpolyesters and processes for the preparation thereof. The terpolyesters of the invention have the structure shown in formula I scheme 1
structure of poly[aryleneterephthalate-co-
(4-oxyphenyl)acetal propionate]

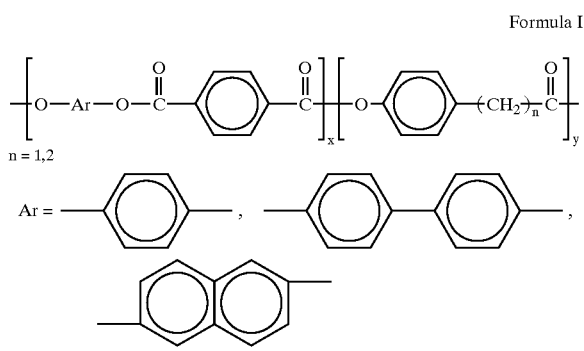

Formula I

The terpolyesters prepared by the process of the present invention are poly (4-phenylene terephthalate-co-oxyphenyl acetate/propionate)s, poly (4,4'-biphenylene terephthalate-co-oxyphenyl acetate/propionate)s, poly (2,6-naphthylene terephthalate-co-oxyphenyl acetate/propionate)s and are liquid crystalline polymers that can be used in electronics (eg. surface mount units, connectors, printing wiring boards etc. where low coefficient of thermal expansion and low dielectric properties are required), in computer fields, in industry for making chemically resistant parts (eg. Tower packing saddles to replace ceramics). The invention can be applied in plastic, electronics and computer industries.

BACKGROUND OF THE INVENTION

Thermotropic liquid crystalline terpolyesters obtained from rigid monomers such as 4-hydroxybenzoic acid are intractable, insoluble and not processable because they decompose prior to melting and their transition temperatures are too high for the existing equipment to process them. (Fr. 1568 152 (May 23, 1969), Carborundum Co., invs.: J. Economy, B. E. Novak; Chem. Abstr. 72, 13412x (1970); Ger. Offen, 2025948, (Dec. 3, 1970), Carborundum Co., invs.: J. Economy, S. G. Cottis, B. E. Novak: Chem. Abstr. 74, 54559k (1971); U.S. Pat. No. 3,962,314 (Jun. 8, 1976), Carborundum Co., invs. J. Economy, S. G. Cottis, B. E. Novak; Chem. Abstr. 85, 193510c (1976) Ger. Offen. 2157696, (Jun. 15, 1976), Carborundum Co., invs.: J. Economy, S. G. Cottis, B. E. Novak: Chem. Abstr. 77, 140738m (1972); U.S. Pat. No. 2,728,747 (Dec. 27, 1955), General Mills Inc., invs.: D. Aelony, M. M. Renfrew; Chem. Abstr. 50, 6098c (1956); Jap.7400397 (Jan. 5, 1974), Mitsubishi Rayon Co., invs.: K. Chimurva, S. Takashima, K. Tamuera; Chem. Abstr. 81, 14001k (1974), Ger. Offen 2907613 (Sep. 4, 1980), BASF, invs.: H. R. Kricheldorf, G. Schwarz; Chem. Abstr. 93, 240249b (1980); H. F. Kuhfuss and W. J. Jackson, Jr., U.S. Pat. No. 3,778,410 (Dec. 11, 1973) to Eastman Kodak: Chem. Abstr. 80, 146894t (1974); H. F. Kuhfuss and W. J. Jackson, Jr., U.S. Pat. No. 3,804,805 (Apr. 16, 1974) to Eastman Kodak: Chem. Abstr. 83, 60301x (1975), ICI Ltd. (Goodman, I., McIntyre, J. E. and Aldred, D. H. ) Bri. Pat. 993272 (priority May 22, 1962), Du Pont (Schaefgen, J. R. et al.) Brit. Pat. 1507207 (priority May 10, 1974, USA); Du Pont (Kleinschuster, J. J.) U.S. Pat. No. 3,991,014 (priority Jul. 16, 1975); A., Blumstein (Ed), Polymeric Liquid Crystals, Plenum Press, New York (1985); C. Noel and P. Navard, *Progr. Polym. Sci.*, 16, 55–110 (1991); Frank, J. Jedlinski and J. Majnus in Hand Book of Polymer Synthesis, H. F. Kricheldorf (Ed), (1991); W. J. Jackson, Jr. and H. F. Kuhfuss, *J. Polym. Sci., Polym. Chem. Ed.*, 14:2043 (1976); W. J. Jackson, Jr. *Macromolecules*, 16:1027 (1983); W. J. Jackson Jr. and H. F. Kuhfuss, *J. Appl. Polym. Sci.*, 25, 1685 (1985); A. J. East, L. F. Charbenneau and G. W. Calundann, *Mol. Cryst. Liq. Inc. Non Linear Opt*, 157, 615 (1988); A. Roviello and A. Sirigu, *J. Polym. Sci. Polym. Lett. Edn.*, 13, 455 (1975); C. K. Ober, J. I. Jin and R. W. Lenz, *Adv. Polym. Sci.*, 13, 103 (1984); A. Blumstein, K. N. Sivaramakrishnan, S. B. Clough and R. B. Blumstein, *Mol. Cryst. Liq. Cryst.(Lett)*, 49, 255 (1979); H. R. Kricheldorf and L. G. Wilson, *Macromolecules*, 27, 1669 (1994); P. K. Bhowmik and H. Han, *J. Polym. Sci. Part A: Polym. Chem.* 33, 415 (1995); V. Percec and H. Oda, *J. Polym. Sci. Part A: Polym. Chem.*33, 2359 )(1995); J. Economy and K. Goranov, *Advances in Polymer Science, Vol.* 117, High Performance Polymers, Springer verlag, Berlin, Heidelberg, 1994; C. K. S. Pillai, D. C. Sherrington and A. Sneddon, *Polymer*, 33, 3968 (1992); M. Saminathan, C. K. S Pillai and C. Pavithran, *Macromolecules*, 26, 7103 (1993); J. D. Sudha, C. K. S. Pillai and S. Bera, *J. Polym. Mater.*, 13, 317 (1996); H. Zhang, G. R. Davies and I. M. Ward, *Polymer*, 33, 2651 (1992)).

There have been a large number of attempts to bring down the transition temperatures to a processable range (W. J. Jackson, Jr. and H. F. Kuhfuss, *J. Appl. Polym. Sci.*, 25, 1685 (1985). A. J. East, L. F. Charbenneau and G. W. Calundann, *Mol. Cryst. Liq. Inc. Non Linear Opt*, 157, 615 (1988); A. Roviello and A. Sirigu, *J. Polym. Sci. Polym. Lett, Edn.*, 13, 455 (1975); C. K. Ober, J. I. Jin and R. W. Lenz, *Adv. Polym. Sci.*, 13, 103 (1984); A. Blumstein, K. N. Sivaramakrishnan, S. B. Clough and R. B. Blumstein, *Mol. Cryst. Liq. Cryst. (Lett)*, 49, 255 (1979); H. R. Kricheldorf and L. G. Wilson, *Macromolecules*, 27, 1669 (1994); P. K. Bhowmik and H. Han, *J. Polym. Sci. Part A: Polym. Chem.* 33, 415 (1995); V. Percec and H. Oda, *J. Polym. Sci. Part A: Polym. Chem.* 33, 2359 (1995); J. Economy and K. Goranov, *Advances in Polymer Science, Vol.* 117, High Performance Polymers, Springer verlag, Berlin, Heidelberg, 1994; *Handbook of polymer science*, N. P. Cheremisinoff (Ed.), vol. 3, synthesis and characterization of Aromatic polyesters; C. K. S. Pillai, D. C. Sherrington and A. Sneddon, *Polymer*, 33, 3968 (1992)). A number of chemical approaches have been devised to arrive at structures that have lower transition temperatures and lower symmetries. These approaches involve disrupting the ordered structures of the homopolyesters by introducing chain disruptors such as flexible unit, a kink structure, or crank shaft structure etc. or by copolymerising with suitable comonomers that bring down the transition temperatures. A number of copolyesters have thus been prepared out of which a few commercial polymers such as Vectra®, and Xydar®, are well known. It is, however, now realised that these copolyesters still have a processing temperature above 300° C. and hence require newer methods or structures to overcome this problem. In this situation, 4-hydroxy phenyl acetic acid, and 3(4-hydroxyphenyl propionic acid), the monomers that possesses a CH$_2$-unit between the carboxyl and the rigid phenyl unit and hence expected to bring down the transition temperature when copolymerised stands a significant chance for contributing to solving this problem. The drawbacks of the currently marketed liquid crystalline polyesters are that, polyesters of 4-hydroxy benzoic acid do not form a melt below its decomposition temperature and liquid crystalline copolyesters like 4-hydroxy benzoic acid/polyethylene terepthalate system (Eastman X7G) has several short comings in that the heat distortion temp is low (<90° C.) and the thermal stability is low because esters of aliphatic diols decompose above 300° C. via cis β elimination to yield olefins. Besides at mole ratios 4-hydroxybenzoic acid/polyethylene terepthalate of greater than 1.5: 1.0, heterogeneous materials are obtained containing crystallites of nearly pure poly (4-hydroxybenzoates). Recently, one fully aromatic LC copolyester (Vectra®) and terpolyester (Xydar®) of 4-hydroxy benzoic acid were commercialised possessing high heat distortion temperatures and high thermal stabilities. However, due to the high melting points of these polyesters (>300° C.) processing is rather difficult.

The homopolyester of 4-hydroxyphenyl acetic acid and its polyester with 4-hydroxy benzoic acid are melt processable liquid crystalline polymers exhibiting clear nematic phase. The terpolyesters of 4-hydroxyphenyl acetic acid and 3(4-hydroxy phenyl)propionic acid with hydroquinone/4,4' biphenol/2,6-naphthylene diol and terephthalic acid are expected to be melt processable with lower melt transition temperatures than that of commercial terpolyesters like Xydar®. Although this is the easiest route to achieve melt processability, there is no publication or patent on the preparation of the terpolyester. Though homopolymerisation of 4-hydroxybenzoic acid is well studied, only a few reports are available on the polymerisation and characterisation of 4-hydroxybenzoic acid containing methylene units between aromatic ring and the carboxyl groups such as 4-hydroxy phenyl acetic acid and 3-(4-hydroxyphenyl) propionic acid. There is one report on the preparation of poly [4-hydroxyphenyl) acetate (Hans-G. Elias, Robert J. Warner, *Makromol. Chem.* 182, 681–686 (1981). However, the molecular weight of the polymer is low and the mesophase behaviour was not studied. Hans R. Kricheldorf, et al have synthesised the homopolyesters of 3(4-hydroxyphenyl) propionic acid. However, the homopolyesters do not show any liquid crystalline properties. On the contrary, its copolyesters with 4-hydroxy benzoic acid showed liquid crystalline transition. (Hans R. Kricheldorf and A. Conradi *J. Polym. Sci. Part A: Polym. Chem. Ed.* 25, 489 (1987). However, this disclosure does not teach the synthesis of liquid crystalline terpolyesters containing terepthalic acid.

Biodegradable thermotropic copolyesters and terpolyesters of 3(4-hydroxyphenyl) propionic acid with vanillic acid, 6-hydroxy-2-naphthoic acid, 4-hydroxy cinnamic acid and 4'-hydroxybiphenyl-4-carboxylic acid were also reported (H. R. Kricheldorf, T. Stukenbrock *Macromol. Chem. Phys.* 198, 3753–3767 (1997); H. R. Kricheldorf, T. Stukenbrock, *Polymer* 38(13), 3373, 1997). However, this disclosure does not teach the synthesis of liquid crystalline terpolyesters containing terepthalic acid.

The preparation of the terpolyester of (4-hydroxyphenyl) acetic acid/3(4-hydroxy phenyl) propionic acid with hydroquinone/4,4' biphenol/2,6-naphthylene diol and terephthalic acid would be advantageous when the cost of the final product is compared with commercial products such as Xydar® and Vectra®. These commercial terpolyesters use comonomers that are expensive. Therefore, the commercial liquid crystalline polymers are highly costly. In contrast, 4-hydroxyphenyl acetic acid/3(4hydroxy phenyl) propionic acid are comparatively cheap and hence, it is possible to achieve a cost effective process for the production of liquid crystalline copolyesters through this route. Another disadvantage of prior art terpolyesters is low decomposition temperature resulting in their decomposition before melting. Prior art terpolyesters also have a higher transition temperature and thus require a higher temperature for melt processing.

OBJECTS OF THE INVENTION

It is an object of the invention to provide novel melt processible thermotropic liquid crystalline terpolyesters.

It is a further object of the invention to provide liquid crystalline melt processable terpolyesters that do not decompose before melting.

A further object of the invention is to provide liquid crystalline terpolyesters that results in higher molecular weight polymers.

It is another object of the invention to provide liquid crystalline terpolyesters having transition temperature lower than that of poly (4-hydroxybenzoic acid).

It is a further object of the invention to provide a process for the preparation of a liquid crystalline terpolyester in the processable range below 300° C. and having nematic mesophase from 4-hydroxyphenyl acetic acid and 3(4-hydroxyphenyl) propionic acid with hydroquinone/4,4' biphenol/2,6-naphthylene diol and terephthalic acid.

It is yet another object of the invention to provide a process for the preparation of a melt processable liquid crystalline terpolyester.

It is a further object of the invention to provide a process for the preparation of liquid crystalline melt processable terpolyesters that do not decompose before melting.

Another object of the invention is to provide a process for the preparation of melt processable liquid crystalline terpolyesters that do not use expensive monomers.

A further object of the invention is to provide a process for the preparation of a liquid crystalline terpolyester that results in a higher molecular weight polymer.

SUMMARY OF THE INVENTION

Accordingly the present invention relates to novel melt processible thermotropic liquid crystalline terpolyesters of the general formula I shown below scheme 1
structure of poly[aryleneterephthalate-co-(4-oxyphenyl)acetal propionate]

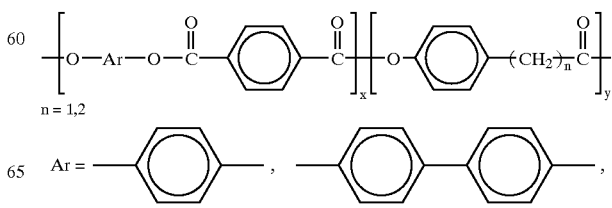

Formula I

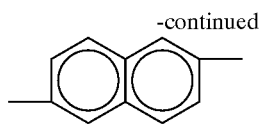

In one embodiment of the invention, the novel liquid crystalline terpolyesters are selected from poly (4-phenylene terephthalate-co-oxyphenyl acetate/propionate)s, poly (4,4'-biphenylene terephthalate-co-oxyphenyl acetate/propionate)s, poly (2,6-naphthylene terephthalate-co-oxyphenyl acetate/propionate)s.

The present invention also provides a process for the preparation of melt processable liquid crystalline terpolyesters of the general formula I scheme 1
structure of poly[aryleneterephthalate-co-(4-oxyphenyl)acetal propionate]

Formula I

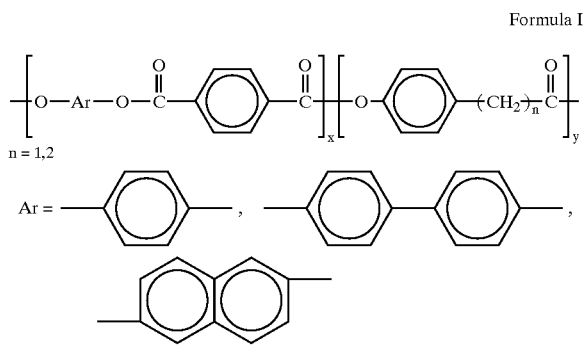

which comprises the steps of in situ acetylation of a monomer selected from 4-hydroxyphenyl acetic acid/3(4-hydroxyphenyl)propionic acid and hydroquinone/4,4'-biphenol/2,6-naphthylene diol followed by acidolysis polycondensation at a temperature in the range of 240–300° C. for a period of about 6–24 hrs under reduced pressure for the efficient removal of acetic acid to effect higher molecular weight formation, post polymerisation being effected at higher temperatures below the decomposition temperature for extended time and purification by solvent extraction using solvent mixtures selected from acetone-alcohol, acetone-methyl ethyl ketone.

In one embodiment of the invention the in situ acetylation is carried out in the presence of a high temperature solvent or without the solvent media.

In another embodiment of the invention, the in situ acetylation is optionally carried out in the presence of a transesterification catalyst selected from the group comprising acetates of lead, magnesium, cobalt and antimony.

In one embodiment of the invention, the terpolyesters prepared are poly(4-phenylene terephthalate-co-oxyphenyl acetate/propionate)s, poly(4,4'-biphenylene terephthalate-co-oxyphenyl acetate/propionate)s, poly (2,6-naphthalene terephthalate-co-oxyphenyl acetate/propionate)s.

In another embodiment of the invention, the acid anhydride used in the acetylation step is selected from the group consisting of phthalic anhydride, trifluoroacetic anhydride, acetic anhydride, chloroacetic anhydride.

In a further embodiment of the invention, the metal acetate catalyst used in the polycondensation step is selected from the group comprising of copper acetate, sodium acetate, magnesium acetate, lead acetate, calcium acetate, zinc acetate, antimony triacetate.

In another embodiment of the invention, the high temperature solvent used during the polycondensation step is selected from the group comprising of Marlotherm®(Huls AG, Marl, Germany), Dowtherm® (M/s Spectrochem, Mumbai, India), dibenzyl benzene.

In another embodiment of the invention, the temperature used for the polycondensation ranges between 240–300° C.

In another embodiment of the invention, the time of polycondensation reaction ranges between 6–24 hrs.

In another embodiment of the invention, the molecular weight of the polymer is improved by a post-polymerisation reaction.

In another embodiment of the invention, the terpolyester has comparatively higher decomposition temperature, Ti of @395° C. compared to poly (4-hydroxyphenyl acetate).

In another embodiment of the invention, the terpolyester of the invention shows nematic mesophase required for the further processing by injection molding and extrusion because of the drastic reduction in viscosity.

The main finding underlying the present invention is our observation that a process for the preparation of poly (4-phenylene terephthalate-co-oxyphenyl acetate/propionate)s, poly(4,4'-biphenylene terephthalate-co-oxyphenyl acetate/propionate)s, and poly (2,6-naphthalene terephthalate-co-oxyphenyl acetate/propionate)s prepared by the process of acidolysis melt polycondensation of 4-acetoxyphenyl acetic acid/3(4-acetoxy phenyl)propionic acid with diacetoxy benzene/4,4'diacetoxy biphenyl/2,6-diacetoxy naphthalene and terephthalic acid at 280° C. has been found to give nematic mesophase transition @ 260° C. with textures corresponding to nematic thread. These terpolyesters are thermotropic liquid crystalline polymers having thermal stability value of Ti(Temperature at which thermal decomposition is initiated) @390° C. and better melt processability at @260° C.

DETAILED DESCRIPTION OF THE INVENTION

The process of the present invention has essentially the following steps: in situ acetylation of the monomers, 4-hydroxyphenyl acetic acid/3(4-hydroxy phenyl) propionic acid and hydroquinone/4,4' biphenol/2,6-naphthalene diol in presence of excess acetic anhydride and acidolysis polycondensation of the acetoxy derivative of the hydroxy acid and the diol with terephthalic acid by acidolysis polycondensation in presence of transesterification catalysts such as magnesium acetate, antimony trioxide, lead acetate etc. at higher temperatures in the order of 240–280° C. for 2–6 hrs in inert atmosphere. Polymerisation was further continued under reduced pressure of 1 mm of Hg at a temperature range of 260–280° C. for a period of 1–6 hrs. This was followed by a post-polymerisation step carried out at a temperature in the range of 260–280° C. under inert atmosphere for 24–72 hrs and a purification step involving soxhlet extraction using solvent mixtures such as acetone-methanol, acetone-methyl ethyl ketone, acetone-isopropanol mixtures.

Acetylation in presence of acetylating agents and catalysts followed by polymerisation at higher temperatures in the presence of a high temperature solvent or without the solvent media, with or without catgalyst at a temperature range of 240–300° C. for a period of about 6–24 hrs in the absence of a catalyst or in presence of transesterification catalysts such as acetates of lead, magnesium, cobalt, antimony etc. under reduced pressure for the efficient removal of acetic acid to effect higher molecular weight formation with post polymerisation effected at higher temperatures below the decomposition temperature for longer times and purification involving soxhlet extraction using solvent mixtures such as acetone-alcohol, acetone-methyl ethyl ketone etc.

The invention is described in detail in the following examples, which are provided by way of illustration only and should not be construed to limit the scope of the invention.

Example 1

In a 60 ml polymerisation tube 0.02 mol of (4-hydroxyphenyl)acetic acid, 0.04 mol of hydroquinone, and 0.02 mol of terephthalic acid were taken mixed with 0.08 mol of acetic anhydride and 0.01 mmol of magnesium acetate were added and heated under slow stirring in a slow purge of nitrogen to 140° C. and continued the heating for ½ hr. Then temperature was increased to 250–300° C. and continued for 2–3 hrs. Polymerisation was further continued at 0.01 mm of Hg pressure for 1–2 hrs. Then the polymer was chipped out of the tube and purified by soxhlet extraction using acetone/isopropanol mixture for about 18 hrs and dried in an air oven at 60° C. for about 3 hrs at reduced pressure.

Example 2

In a 60 ml polymerisation tube 0.033 mol of 3(4-hydroxyphenyl)propionic acid, 0.033 mol of hydroquinone, and 0.033 mol of terephthalic acid were taken mixed with 0.08 mol of acetic anhydride and 0.01 mmol of magnesium acetate were added and heated under slow stirring in a slow purge of nitrogen to 140° C. and continued the heating for ½ hr. Then temperature was increased to 250–300° C. and continued for 2–3 hrs. in presence of 3 ml of high temperature solvent Dowtherm®. Polymerisation was further continued at 0.01 mm of Hg pressure for 1–2 hrs. Then the polymer was chipped out of the tube and purified by soxhlet extraction using acetone/isopropanol mixture for about 18 hrs and dried in an air oven at 60° C. for about 3 hrs at reduced pressure.

Example 3

In a 60 mol polymerisation tube 0.02 mol of 4-hydroxyphenyl acetic acid, 0.04 mol of 4,4'-biphenol, and 0.02 mol of terephthalic acid were taken mixed with 0.08 mol of acetic anhydride and 0.01 mmol of magnesium acetate were added and heated under slow stirring in a slow purge of nitrogen to 140° C. and continued the heating for ½ hr. Then the temperature was increased to 240–300° C. and continued for 2–3 hrs. Polymerisation was further continued at 0.01 mm of Hg pressure for 1–2 hrs. Then the polymer was chipped out of the tube and purified by soxhlet extraction using acetone-isopropanol mixture for about 18 hrs and dried in an air oven at 60° C. for about 3 hrs at reduced pressure.

Example 4

In a 60 ml polymerisation tube 0.033 mol of 3(4-hydroxyphenyl)propionic acid, 0.033 mol of 4,4'-biphenol, and 0.033 mol of terephthalic acid were taken mixed with 0.08 mol of acetic anhydride and 0.01 mmol of magnesium acetate were added and heated under slow stirring in a slow purge of nitrogen to 140° C. and continued the heating for ½ hr. Then temperature was increased to 250–300° C. and continued for 2–3 hrs in presence of 3 ml of high temperature solvent Dowtherm®. Polymerisation was further continued at 0.01 mm of Hg pressure for 1–2 hrs. Then the polymer was chipped out of the tube and purified by soxhlet extraction using acetone-isopropanol mixture for about 18 hrs and dried in an air oven at 60° C. for about 3 hrs at reduced pressure.

Example 5

In a 60 ml polymerisation tube 0.02 mol of (4-hydroxyphenyl)acetic acid, 0.04 mol of 2,6-naphthalene diol, and 0.02 mol of terephthalic acid were taken mixed with 0.08 mol of acetic anhydride and 0.01 mmol of lead acetate were added and heated under slow stirring in a slow purge of nitrogen to 140° C. and continued the heating for ½ hr. Then temperature was increased to 250–280° C. and continued for 2–4 hrs. Polymerisation was further continued at 0.01 mm of Hg pressure for 1–6 hrs. Then the polymer was chipped out of the tube, powdered and purified by soxhlet extraction using acetone-isopropanol mixture for about 18 hrs and dried in an air oven at 60° C. for about 3 hrs at reduced pressure. Then the product was post polymerised at 300° C. for 24 hrs under inert atmosphere. Then it was cooled to ambient conditions and the polymer was chipped out of the tube, washed with acetone, filtered, dried in an air oven at 65° C. for 2 hrs, powdered in an agate mortar and further purified by extracting for 24 hrs in a soxhlet extractor using acetone-isopropanol mixture. It was then further dried under reduced pressure in an air oven at 65° C.

Example 6

In a 60 ml polymerisation tube 0.033 mol of 3(4-hydroxyphenyl) propionic acid, 0.033 mol of 2,6-naphthalene diol, and 0.033 mol of terephthalic acid were taken mixed with 0.08 mol of acetic anhydride and 0.01 mmol of magnesium acetate were added and heated under slow stirring in a slow purge of nitrogen to 160° C. and continued for heating for ½ hr. Then temperature was increased to 240–260° C. and continued for 12 hrs. in presence of 3 ml of high temperature solvent Dowtherm®. Polymerisation was further continued at 0.01 mm of Hg pressure for 6–12 hrs. Then the polymer was chipped out of the tube, washed, powdered and purified by soxhlet extraction using acetone-isopropanol mixture for about 18 hrs and dried in an air oven at 60° C. for about 3 hrs at reduced pressure.

The present invention provides a process for the preparation of melt processable liquid crystalline terpolyester from 4-hydroxyphenyl acetic acid/3(4 hydroxy phenyl) propionic acid and hydroquinone/4,4' biphenol/2, 6-naphthalene diol. The liquid crystalline terpolyester obtained from 4-hydroxyphenyl acetic acid/3(4- hydroxy phenyl) propionic acid and hydroquinone/4, 4' biphenol/2, 6-naphthalene diol of formula I has a transition temperature @ 260° C., which is lower than those (300° C.) of the commercial liquid crystalline copolyester such as Vectra® and terpolyesters such as Xydar®. Hence, the liquid crystalline terpolyester obtained by the process of the present invention can be melt processed at a lower temperature than that of Vectra® and Xydar® and this may solve many of the processing problems associated with the existing commercial liquid crystalline polymers. The liquid crystalline terpolyesters obtained by the process of the present invention do not decompose before melting whereas poly 4-hydroxy benzoate decomposes prior to melting. As the present invention described by the present process of preparation of liquid crystalline terpolyester from 4-hydroxy phenyl acetic acid/ 3(4-hydroxy phenyl) propionic acid and hydroquinone/4,4' biphenol/2,6-naphthalene diol does not use a comonomer which is too expensive, the cost of the liquid crystalline terpolyester obtained by the present process is rather low when compared to those of Vectra® and Xydar®. Commercial copolyesters use comonomers such as derivatives of hydroxynaphthoic acid which are expensive and therefore, the commercial liquid crystalline polymers are costly. In contrast, 4-hydroxy phenyl acetic acid, and hydroquinone the comonomers used in the preparation of the terpolyester prepared by the process of the present invention, is comparatively cheaper. The process of the present invention has a step of post-polymerisation whereby a higher molecular weight is obtained so that the properties of the polymer are better. This terpolyester has got comparatively higher decomposition temperature, Ti of @390° C. The cost of the terpolyesters are comparatively less compared to the commercial copolyesters. It shows drastic reduction in viscosity due to nematic mesophase, which is required for further processing by injection molding and extrusion.

We claim:

1. Novel melt processible thermotropic liquid crystalline terpolyesters of the general formula I scheme 1
structure of poly[aryleneterephthalate-co-
(4-oxyphenyl)acetal propionate]

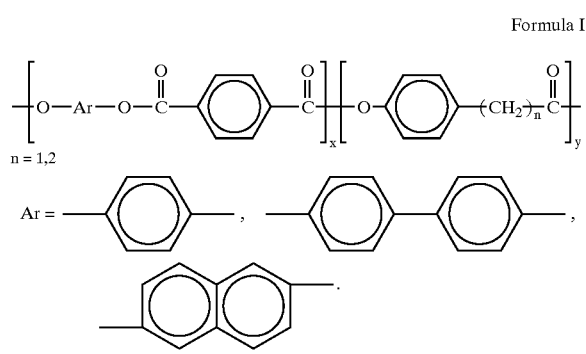

Formula I

2. Melt processible thermotropic liquid crystalline terpolyesters as claimed in claim 1 selected from poly(4-phenylene terephthalate-co-oxyphenyl acetate/propionate)s, poly (4,4'-biphenylene terephthalate-co-oxyphenyl acetate/propionate)s, poly (2,6-naphthylene terephthalate-co-oxyphenyl acetate/propionate)s.

3. A process for the preparation of melt processable liquid crystalline terpolyesters of the general formula I scheme 1
structure of poly[aryleneterephthalate-co-
(4-oxyphenyl)acetal propionate]

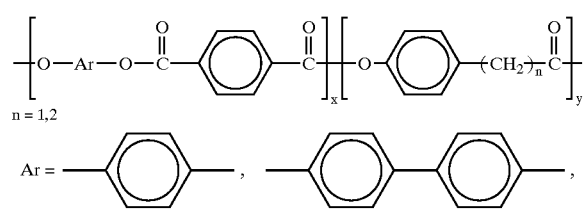

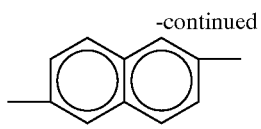

comprising the steps of in situ acetylation of a monomer selected from 4-hydroxy phenyl acetic acid/3(4-hydroxyphenyl)propionic acid and hydroquinone/4,4'-biphenol/2,6-naphthalene diol followed by acidolysis polycondensation at a temperature in the range of 240–300° C. for a period of about 6–24 hrs under reduced pressure for the efficient removal of acetic acid, post polymerisation being effected at temperatures below the decomposition temperature for extended time and purification by solvent extraction using solvent mixtures selected from acetone-alcohol, and acetone-methyl ethyl ketone.

4. A process as claimed in claim 3 wherein the polycondensation step is carried out in the presence or absence of a solvent.

5. A process as claimed in claim 3 wherein the in situ acetylation is carried out in the presence of a transesterification catalyst selected from the group comprising acetates of lead, magnesium, cobalt and antimony.

6. A process as claimed in claim 3 wherein the in situ acetylation is carried out using an acid anhydride selected from the group consisting of phthalic anhydride, trifluoroacetic anhydride, acetic anhydride, and chloroacetic anhydride.

7. A process as claimed in claim 5 wherein the polycondensation is carried out in the presence of a metal acetate catalyst selected from the group consisting of copper acetate, sodium acetate, magnesium acetate, lead acetate, calcium acetate, zinc acetate, and antimony triacetate.

8. A process as claimed in claim 4 wherein the solvent used during the polycondensation step is selected from benzene or a mixture of dibenzyl benzene with tribenzyl benzene.

9. A process as claimed in claim 3 wherein the temperature used for the polycondensation ranges between 240–300° C.

10. A process as claimed in claim 3 wherein a post-polymerisation reaction is carried out to increase the molecular weight of the polymers.

11. A process as claimed in claim 3 wherein the terpolyester has a decomposition temperature (Ti) of about 395° C.

12. A process as claimed in claim 3 wherein the terpolyester prepared show nematic mesophase required for the further processing by injection molding and extrusion due to drastic reduction in viscosity.

* * * * *